(12) United States Patent
Oda

(10) Patent No.: US 7,544,102 B2
(45) Date of Patent: Jun. 9, 2009

(54) PLUNGER-TYPE CONTACT UNIT

(75) Inventor: Takahiro Oda, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 11/843,731

(22) Filed: Aug. 23, 2007

(65) Prior Publication Data
US 2008/0050944 A1    Feb. 28, 2008

(30) Foreign Application Priority Data
Aug. 25, 2006   (JP)   ............................ 2006-229490

(51) Int. Cl.
*H01R 13/24* (2006.01)
(52) U.S. Cl. ...................... 439/700; 439/824
(58) Field of Classification Search ............. 439/68–70, 439/842, 152, 330–331, 66, 700, 824, 591, 439/74, 91
See application file for complete search history.

(56) References Cited

U.S. PATENT DOCUMENTS 6,743,043 B2 * 6/2004 Yamada ...................... 439/482
6,758,682 B1 * 7/2004 Kosmala ...................... 439/66
2004/0005791 A1 * 1/2004 Sato et al. ...................... 439/66
2004/0029412 A1 * 2/2004 Hachuda et al. ............... 439/66
2005/0266734 A1 * 12/2005 Kazama ...................... 439/700

FOREIGN PATENT DOCUMENTS

JP      2003-307542     10/2003

\* cited by examiner

*Primary Examiner*—Briggitte R Hammond
*Assistant Examiner*—Vanessa Girardi
(74) *Attorney, Agent, or Firm*—Staas & Halsey LLP

(57) ABSTRACT

A contact unit which enables reduction of an interval between contacts to be inserted into a through hole formed in a plate. A contact of an IC socket is formed so that a first flange portion is disposed in a first gap between an upper plate and an intermediate plate while an outside diameter of the first flange portion is set larger than a diameter of an upper through hole of the upper plate and that a second flange portion is disposed in a second gap between an intermediate plate and a lower plate while an outside diameter of a second flange portion is set larger than a diameter of a lower through hole of the lower plate.

3 Claims, 11 Drawing Sheets

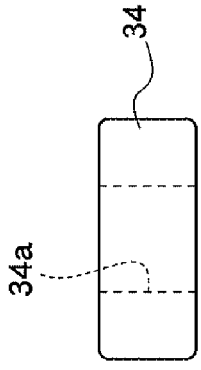
FIG.8A
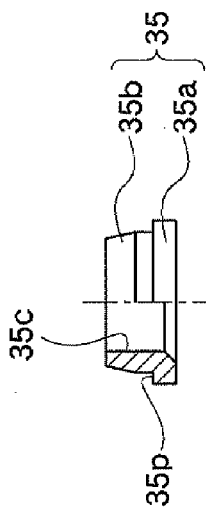
FIG.8B
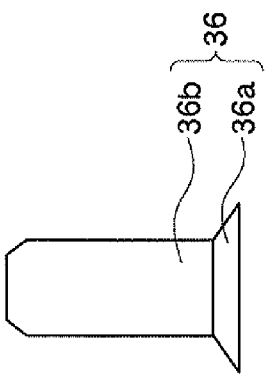
FIG.8D
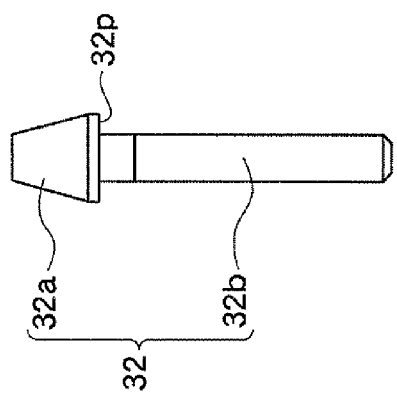
FIG.8C
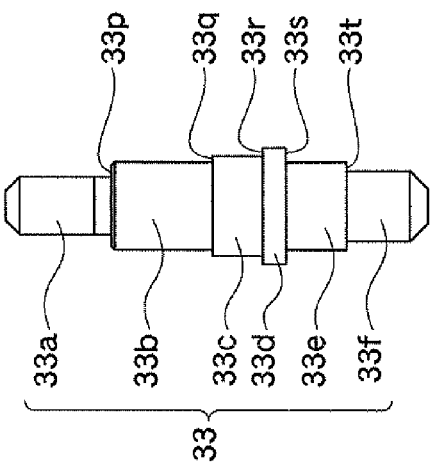
FIG.8E
FIG.8F FIG.10A
FIG.10B
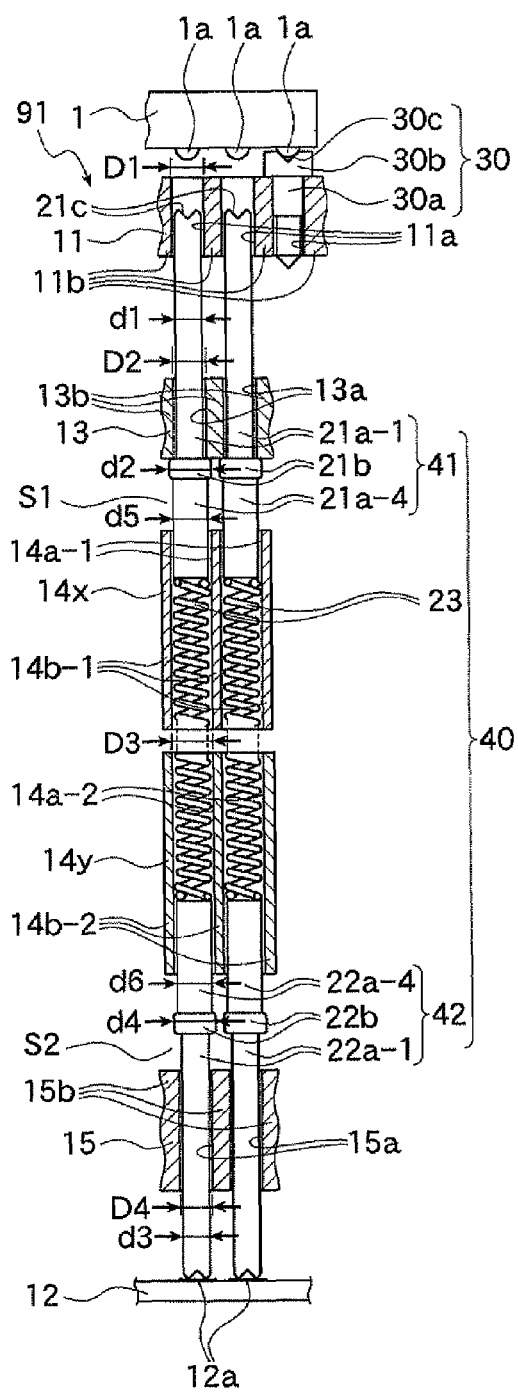
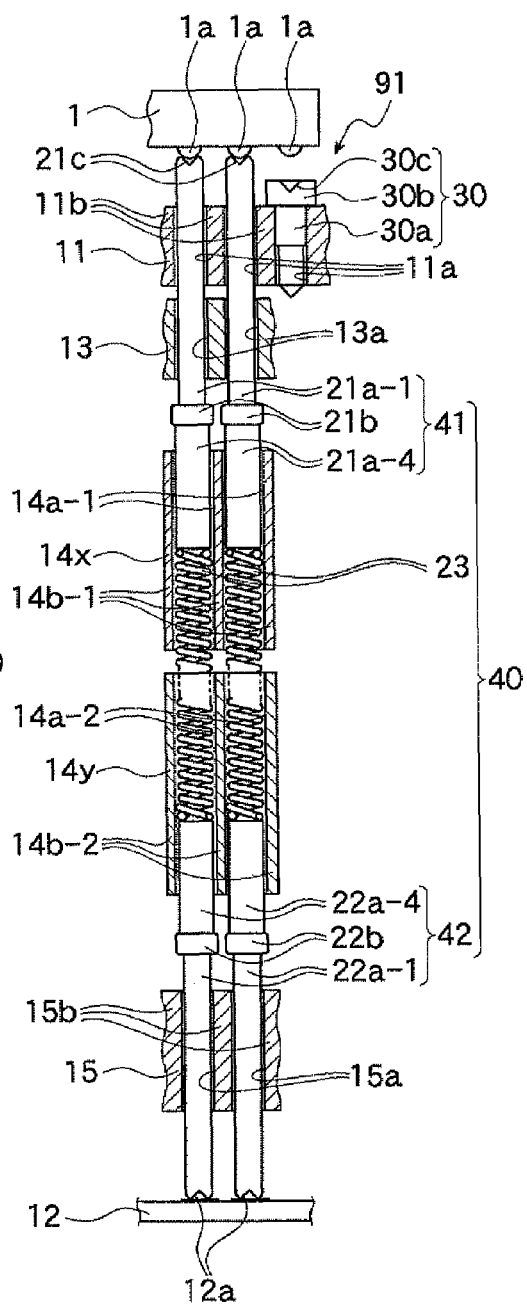

PLUNGER-TYPE CONTACT UNIT

BACKGROUND OF THE INVENTION

1. Field of the Invention

The present invention relates to a contact unit which is disposed between a first electrical part and a second electrical part and in which the first electrical part and the second electrical part are connected electrically through a plurality of contacts.

2. Prior Art of the Invention

Conventionally, in some type of a contact unit for testing electrical parts, a plurality of plates into which a plurality of contacts are inserted are provided and a plurality of through holes into which a plurality of the contacts are inserted are formed in each plate, the contact being extended/contracted within the through hole so as to achieve electrical contact between the electrical parts through the contact.

As an invention concerning the technology of such a contact disposing structure, an invention as described in Patent Document 1 (Japanese Patent Application Laid-Open Publication No. 2003-307542) has been known. The patent document 1 describes with reference to its FIGS. 1-13, "a socket for an electrical part which is disposed on a wiring board and has a socket body for accommodating the electrical part, the wiring board and the electrical part being electrically connected through a plurality of contacts disposed on the socket body, wherein an accommodating member on which the electrical part is mounted is provided on the top of the socket body while the wiring board is provided on the lower side of the socket body and a plurality of plates are stacked between the accommodating member and the wiring board without any gap, the plurality of the plates including upper plates disposed at the uppermost position, a lower plate disposed at the lowermost position and an intermediate plate disposed between the upper plate and the lower plate. Further the same document describes "the contact comprising a terminal side contact member which makes contact with a terminal, a base plate side contact member which makes contact with the wiring board, and a spring member provided between the terminal side contact member and the base plate side contact member, the terminal side contact member having a first rod-like portion which makes contact with the terminal and a first flange portion which is provided halfway of the first rod-like portion and makes contact with an upper end of the spring member, the base plate side contact member comprising a second rod-like portion which makes contact with the substrate and a second flange portion which is provided halfway of the second rod-like portion and makes contact with a bottom end of the spring member, the first flange portion and the second flange portion being disposed within an intermediate through hole formed in the intermediate plate".

In case of manufacturing the contact disposing structure having stacked plates described in the patent document 1, a plurality of through holes are formed in each plate. Upon production of multiple kinds of products in each small quantity, manufacturing by cutting requires less manufacturing cost and shorter manufacturing time than manufacturing with a mold.

However, if the through holes are formed by cutting, more time and more cost may be required than a case of molding in order to obtain a higher accuracy and there is a fear that any mounting misalignment may occur between plates to be stacked. Therefore, the through hole needs to be made larger than required, which is a problem to be solved.

On the other hand, if the contacts are disposed to a socket for an electrical part at a small pitch, there is a limitation in reduction of the thickness of a partition wall portion which sets the through holes apart from each other at an interval.

SUMMARY OF THE INVENTION

Accordingly, it is an object of the present invention to provide a contact structure in which the diameter of a through hole formed in an intermediate plate can be reduced while maintaining the thickness of a partition wall which partitions the through holes to a minimum extent, thereby reducing the interval between the contacts to be inserted into the through hole.

To achieve such an object, according to the present invention, there is provided a contact unit which is disposed between a first electrical part and a second electrical part and in which the first electrical part and the second electrical part are electrically connected through a plurality of contacts, wherein a first plate and a second plate are stacked with a gap between the first electrical part and the second electrical part while the first electrical part, the first plate, the second plate and the second electrical part are disposed in this order and the first plate and the second plate are provided with through holes into which at least a part of the contact is inserted, the contact has a contact side member capable of making contact with the first electrical part and a spring member which urges the contact side member toward the first plate, the contact side member comprises a contact side rod-like portion which is inserted into the through hole of the first plate and capable of making contact with the first electrical part, a spring side rod-like portion which is inserted into the through hole of the second plate and capable of making contact with the spring member and the flange portion formed between the contact side rod-like portion and the spring side rod-like portion, the flange portion is formed larger than the through hole of the first plate and disposed in a gap between the first plate and the second plate and the spring side rod-like portion is urged toward the first plate of the spring member.

According to another aspect of the present invention, the contact side member is formed so that an end portion of the spring member side of the spring side rod-like portion is made larger than the inside diameter of the spring member.

According to still another aspect of the present invention, the contact side member includes the contacting side rod-like portion and the flange portion formed at an end portion on the second plate side of the contact side rod-like portion and the flange portion makes a direct contact with the spring member so that it is urged toward the first plate side.

According to another invention, there is provided a contact unit which is disposed on a first electrical part and provided on a socket body accommodating a second electrical part and in which the first electrical part and the second electrical part are electrically connected through a plurality of contacts, wherein an upper plate, an intermediate plate, and a lower plate are stacked in this order from the above with a gap formed between each plate and the upper plate, the intermediate plate and the lower plate are provided with through holes into which the contact is inserted, the contact includes a first electrical part side contact member which makes contact with the first electrical part, a second electrical part side contact member which makes contact with the second electrical part, and a spring member which is provided between the first electrical part side contact member and the second electrical part side contact member so as to urge the first electrical part side contact member and the second electrical part side contact member in a direction departing from each other, the first electrical part side contact member includes a first rod-like portion disposed extending from the through hole of the upper plate to the through hole of the intermediate plate and a first flange portion provided halfway of the first rod-like portion and the second electrical part side contact member includes a second rod-like portion disposed extending from the through hole of the lower plate to the through hole of the intermediate plate and a second flange portion provided halfway of the second rod-like portion, the first flange portion is formed larger than the through hole of the upper plate and disposed in a gap between the upper plate and the intermediate plate so that the first electrical part side contact member is urged toward the upper plate by the spring member, and the second flange portion is formed larger than the through hole of the lower plate and disposed in a gap between the lower plate and the intermediate plate so that the second electrical part side contact member is urged toward the lower plate by the spring member.

According to the present invention, the first plate and the second plate are stacked with a gap formed between the first electrical part and the second electrical part and the first electrical part, the first plate, the second plate and the second electrical part are disposed in this order. A through hole through which at least a part of the contact is inserted, is formed in each of the first plate and the second plate. The contact includes a contact side member which can make contact with the first electrical part and the spring member for urging the contact side member toward the first plate. The contact side member includes a contacting side rod-like portion which is inserted into the through hole in the first plate to make a contact with the first electrical part, a spring side rod-like portion which is inserted into the through hole of the second plate to make a contact with the spring member and a flange portion formed between the contacting side rod-like portion and the spring-side rod-like portion. The flange portion is formed larger than the through hole of the first plate and disposed in a gap between the first plate and the second plate, so that the spring side rod-like portion is urged toward the first plate by the spring member.

Therefore, because the flange portion is disposed in the gap between the first plate and the second plate, the diameter of the through hole formed in the second plate can be formed in a small size while maintaining the thickness of the partition wall portion which partitions between the through holes to a minimum extent, thereby reducing the pitch of the contacts disposed in the socket body.

According to other aspect, the contact side member is formed so that the end portion of the spring member side of the spring side rod-like portion is made larger than the inside diameter of the spring member.

Consequently, the flange portion will not be caught within the through hole of the second plate as compared with a conventional case where a plurality of plates are stacked without any gap and the flange portion is disposed within the second plate. Therefore, the contact side member can move vertically within the first plate smoothly, so that the elastic force of the spring member can be used effectively for a contact with the first electrical part.

According to other aspect of the invention, the contact side member includes the contacting side rod-like portion and the flange portion formed at an end portion of the second plate side of the contacting side rod-like portion and the flange portion makes a direct contact with the spring member so that it is urged toward the first plate side.

With such a structure, the flange portion will not be caught within the through hole of the second plate as compared with a conventional case in which a plurality of plates are stacked without any gap and the flange portion is disposed within the second plate. Further, such a simple structure in which no member is provided between the flange portion and the spring member can be attained.

Accordingly, the contact side member can move vertically within the first plate smoothly and the elastic force of the spring member can be used effectively for a contact with the first electrical part thereby eliminating the necessity of manufacturing cost for the contact side member.

According to other aspect of the present invention, an upper plate, an intermediate plate, and a lower plate are stacked in this order from the above with a gap formed between each plate and the upper plate, the intermediate plate and the lower plate are provided with through holes into which the contact is inserted, the contact includes a first electrical part side contact member which makes contact with the first electrical part, a second electrical part side contact member which makes contact with the second electrical part, and a spring member which is provided between the first electrical part side contact member and the second electrical part side contact member so as to urge the first electrical part side contact member and the second electrical part side contact member in a direction of departing from each other, the first electrical part side contact member includes a first rod-like portion disposed extending from the through hole of the upper plate to the through hole of the intermediate plate and a first flange portion provided halfway of the first rod-like portion and the second electrical part side contact member includes a second rod-like portion disposed extending from the through hole of the lower plate to the through hole of the intermediate plate and a second flange portion provided halfway of the second rod-like portion, the first flange portion is formed larger than the through hole of the upper plate and disposed in a gap between the upper plate and the intermediate plate so that the first electrical part side contact member is urged toward the upper plate by the spring member, and the second flange portion is formed larger than the through hole of the lower plate and disposed in a gap between the lower plate and the intermediate plate so that the second electrical part side contact member is urged toward the lower plate by the spring member.

Therefore, because the first flange portion is disposed in the gap between the upper plate and the intermediate plate and the second flange portion is disposed in the gap between the lower plate and the intermediate plate, the thickness of the partition wall which partitions between the through holes can be maintained to a minimum extent and the diameter of the through hole formed in the intermediate plate can be set in a small size, thereby reducing the pitch of the contacts disposed in the contact unit.

BRIEF DESCRIPTION OF THE DRAWINGS

FIG. 4A is a side view showing the structure of a terminal side contact member, FIG. 4B is a side view showing the structure of a base plate side contact member and FIG. 4C is a side view showing the structure of a spring member;

FIG. 5A is a side view of the positioning insertion rod and FIG. 5B is a plan view of the positioning insertion rod;

FIG. 6A is an enlarged sectional view showing a condition in which the floating plate is located at the uppermost position and FIG. 6B is an enlarged sectional view showing a condition in which the floating plate is at the lowermost position;

FIG. 7A is a plan view of the IC package and FIG. 7B is a side view of the IC package;

FIGS. 8A, 8B, 8C, 8D, 8E, 8F show a member for fixing a socket body and a plurality of plates of the same embodiment and FIGS. 8A, 8B, 8C, 8D, 8E, 8F are side views of a fixed member;

FIGS. 10A, 10B are enlarged sectional views showing the relation among the IC package, a plurality of plates and wiring board of a second embodiment of the present invention and FIG. 10A is an enlarged sectional view showing a condition in which the floating plate is located at the uppermost position and FIG. 10B is an enlarged sectional view showing a condition in which the floating plate is at the lowermost position; FIG. 11A is an enlarged sectional view showing a condition in which the floating plate is located at the uppermost position and FIG. 11B is an enlarged sectional view showing a condition in which the floating plate is located at the lowermost position.

DETAILED DESCRIPTION

Hereinafter, a first embodiment of the present invention will be described.

FIGS. 1-9 show the first embodiment of the present invention.

Figure 1:
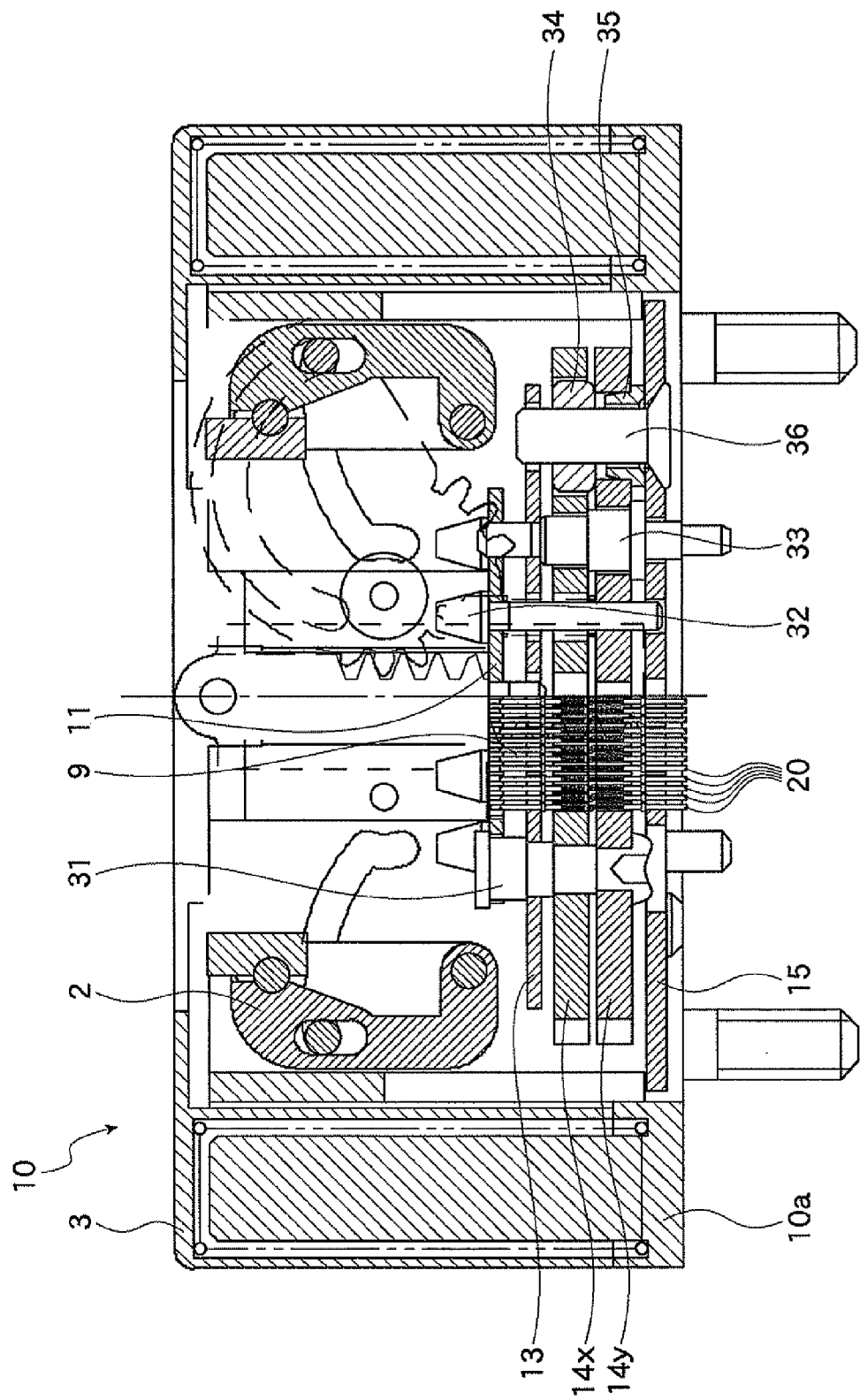
FIG. 1 is a sectional view showing a condition in which an operating member for a socket for an electrical part of the first embodiment.
Figure 2:
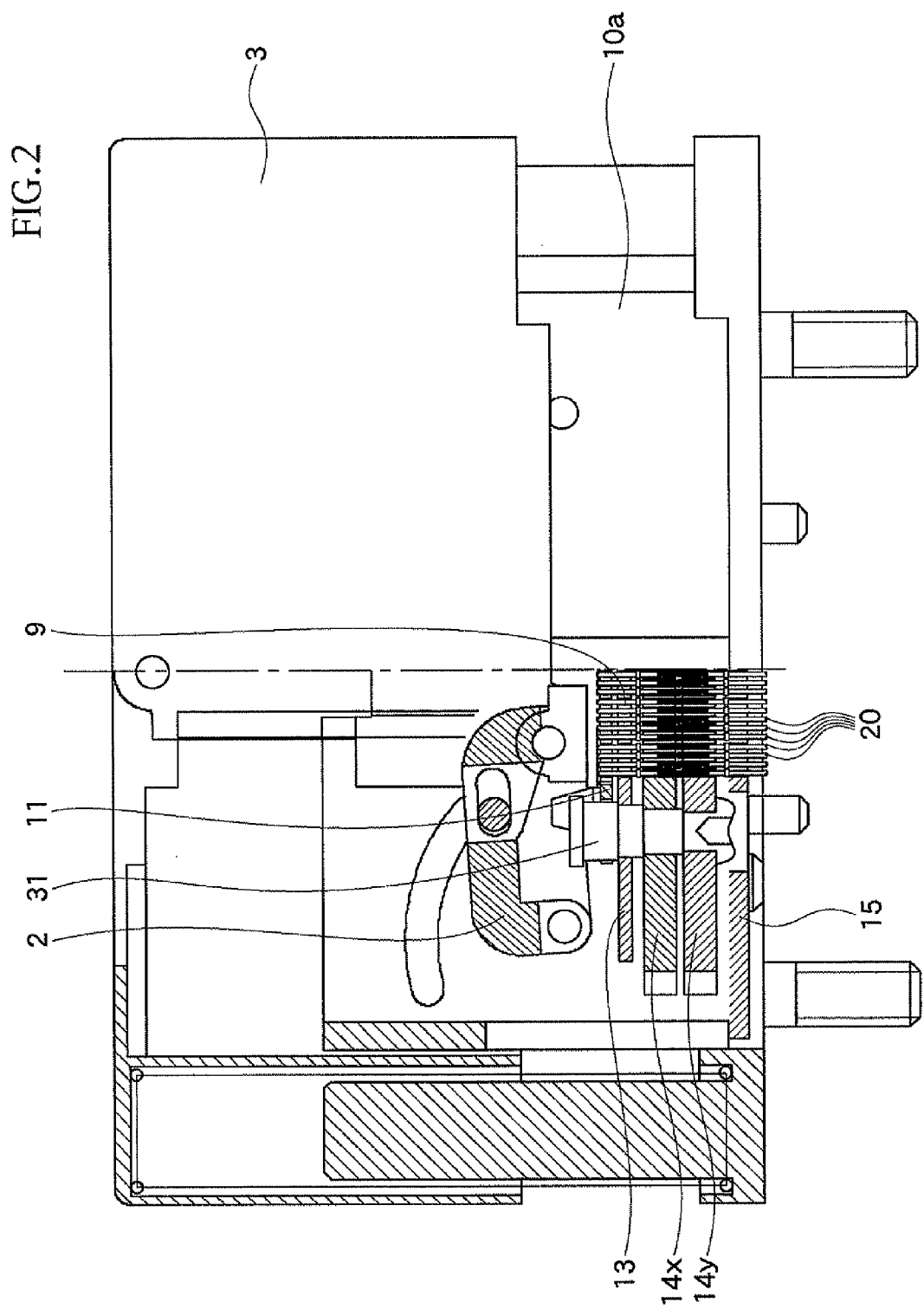
FIG. 2 is a sectional view showing a condition in which the operating member for a socket for an electrical part according to this embodiment is raised.
Figure 6A:
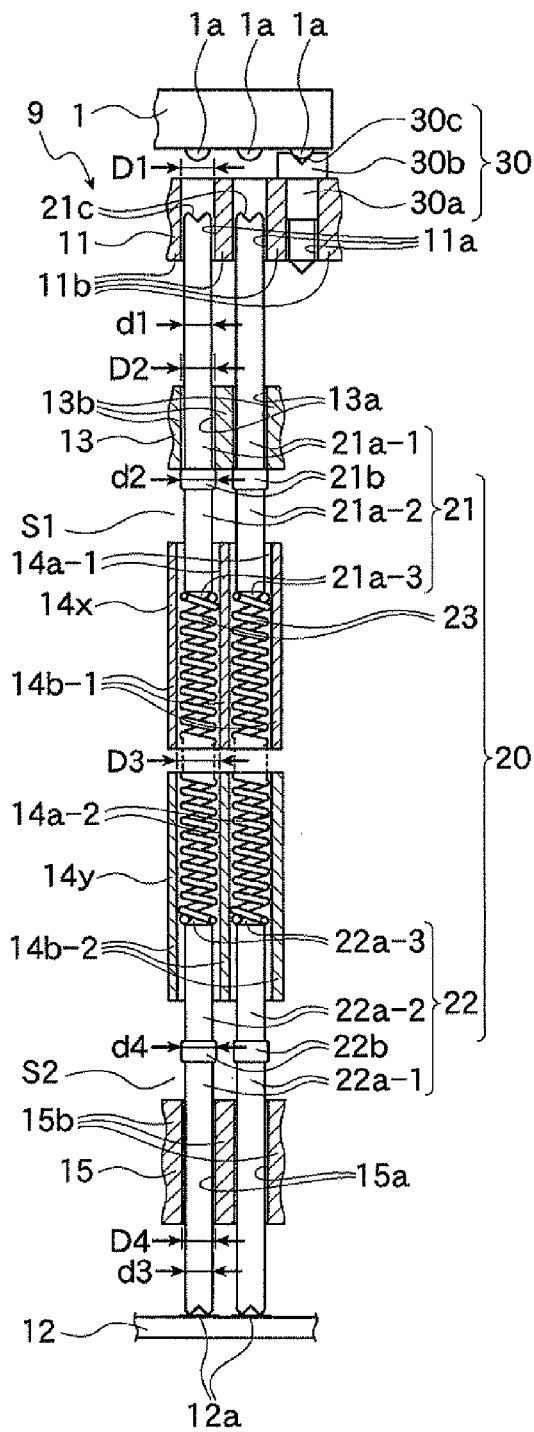
FIGS. 6A, 6B are enlarged sectional views showing the relation among the IC package, the plurality of plates and wiring board of the same embodiment
Figure 6B:
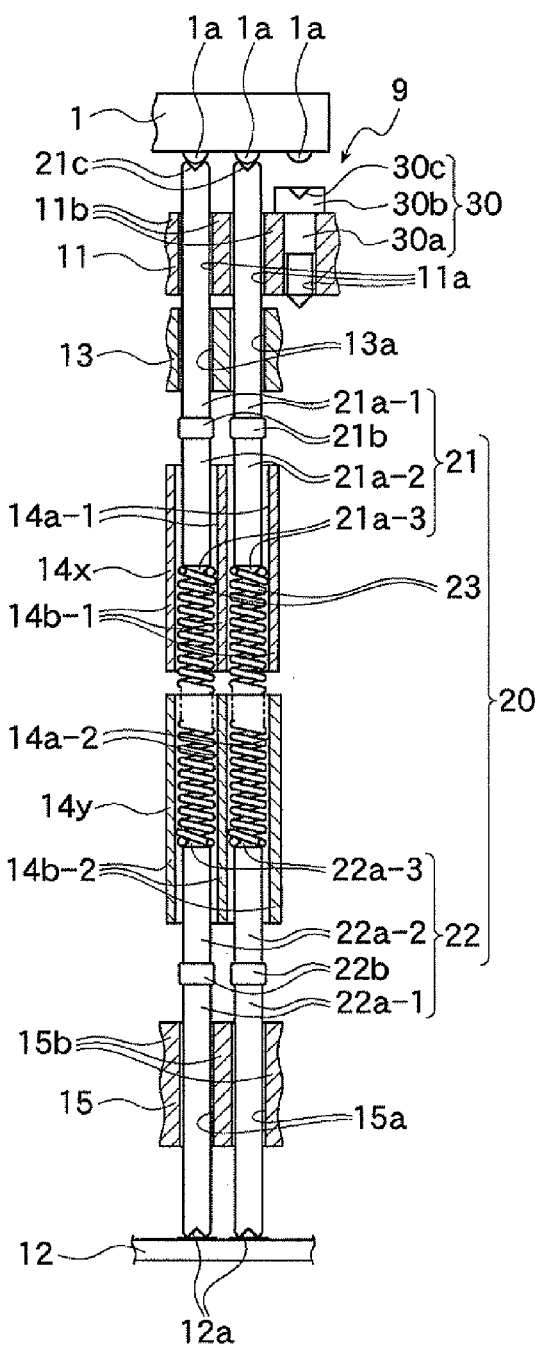
Figure 7A:
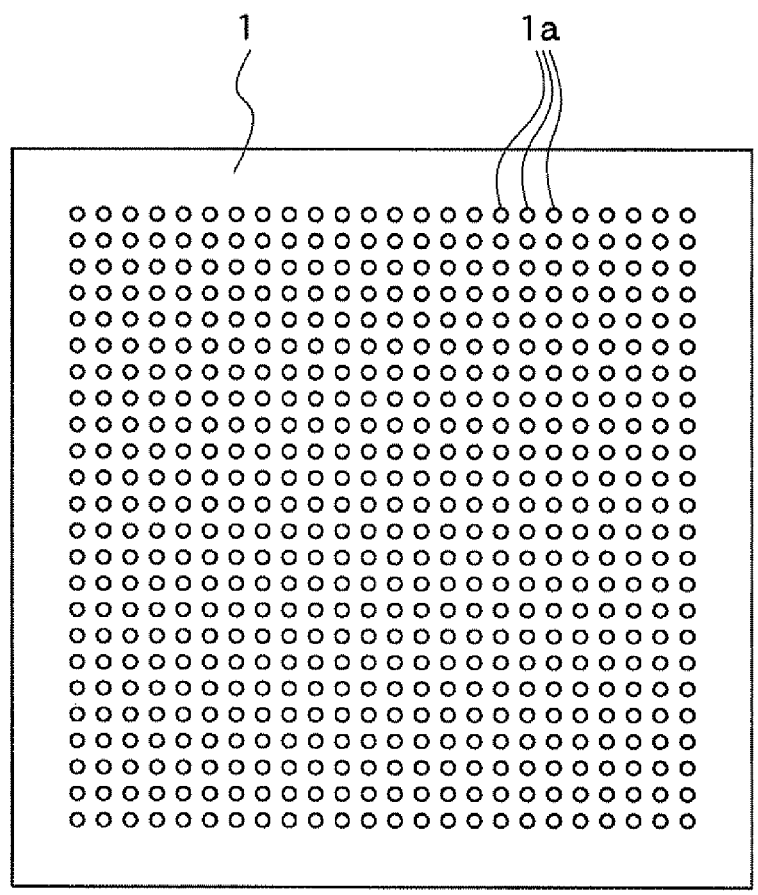
FIGS. 7A, 7B show the structure of the IC package for use in an IC socket of the same embodiment
Figure 7B:
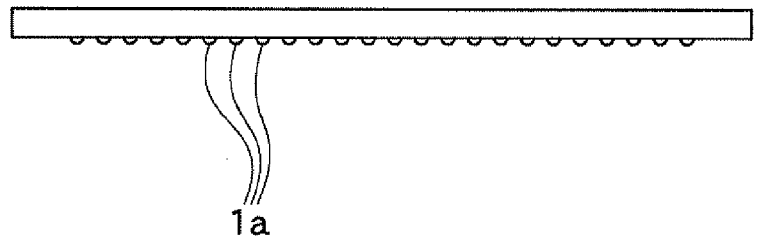

Firstly, the structure of the first embodiment will be explained. As shown in FIGS. 1,2, an IC socket 10 as a "socket for an electrical part" comprises an operating member 3 having a pressing portion 2 for pressing the IC package 1 (see FIGS. 7A, 7B) as a "first electrical part" and a socket body 10a provided with a contact unit 9. A plurality of contacts 20 is disposed in this socket body 10a. The socket body 10a is disposed on a wiring board 12 (see FIGS. 6A, 6B) as a "second electrical part" and formed to be capable of accommodating an IC package 1. The IC package 1 is provided with a plurality of solder balls 1a as each terminal as shown in FIGS. 7A, 7B. As shown in FIGS. 6A, 6B, the IC package 1 and the wiring board 12 are electrically connected through a plurality of the contacts 20.

Figure 3:
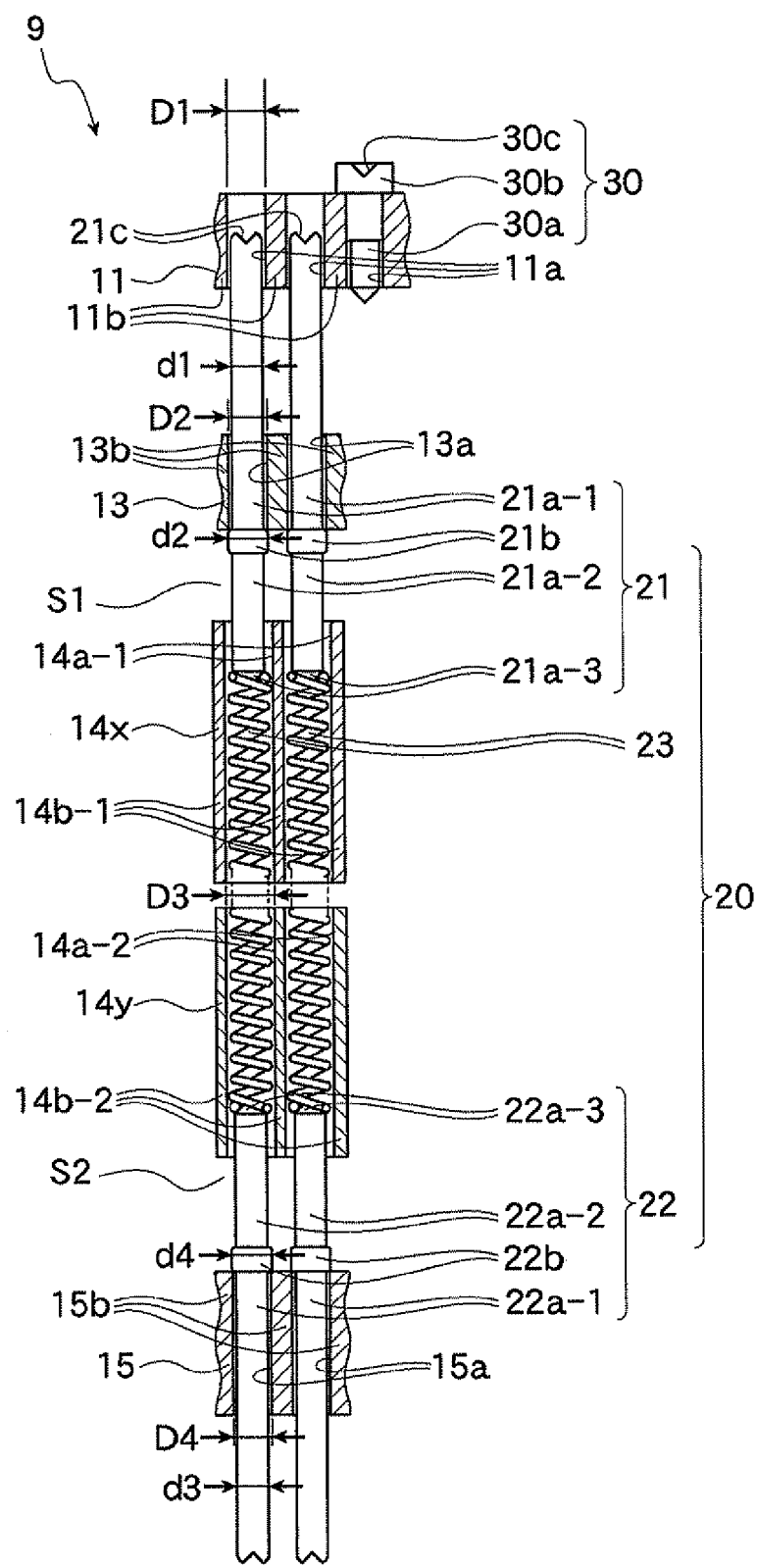
FIG. 3 is an enlarged sectional view showing the relation between the contact of the same embodiment and a plurality of plates.

As shown in FIG. 3, the socket body 10a are disposed with a floating plate 11 as an "accommodation member" for accommodating the IC package 1, an upper plate 13 as a "first plate" which is a part of the contact unit 9, an intermediate plate 14x as a "second plate" which is a part of the contact unit 9, an intermediate plate 14y as a "second plate" which is a part of the contact unit 9 and a lower plate 15 as a "first plate" which is a part of the contact unit 9, in this order from the above. These plates 11, 13, 14x, 14y, 15, the IC package 1 and the wiring board 12 are stacked in the order of the IC package 1, the upper plate 13, the intermediate plate 14a, the intermediate plate 14y, the lower plate 15 and the wiring board 12 with a gap formed between each plate. A gap S1 is provided between the upper plate 13 and the intermediate plate 14x and a gap S2 is provided between the intermediate plate 14y and the lower plate 15.

The upper plate 13, the intermediate plates 14x, 14y and the lower plate 15 are disposed to be fixed where as the floating plate 11 is disposed to be vertically movable with respect to the plates 13-15 while accommodating the IC package 1.

As shown in FIG. 3, a plurality of accommodation through holes 11a into which at least a part of the contact 20 is inserted, is formed in the floating plate 11 and a plurality of upper through holes 13a into which the contact 20 is inserted, is formed. A plurality of intermediate through holes 14a-1 through which the contact 20 is inserted, is formed in the intermediate plate 14x and a plurality of intermediate through holes 14a-2 through which the contact 20 is inserted, is formed in the intermediate plate 14y. A plurality of lower through holes 15a into which the contact 20 is inserted, is formed in the lower plate 15. A partition wall portion 11b which partitions between the accommodation through holes 11a is formed in the floating plate 11 and a partition wall portion 13b which partitions between the upper through holes 13a is formed in the upper plate 13. A partition wall portion 14b-1 which partitions between the intermediate through holes 14a-1 is formed in the intermediate plate 14x and a partition wall portion 14b-2 which partitions between the intermediate through holes 14a-2 is formed in the intermediate plate 14y. A partition wall portion 15b which partitions between the lower through holes 15a is formed in the lower plate 15. The diameter of the accommodation through hole 11a is shown as D1, the diameter of the upper through hole 13a is shown as D2, the diameter of the intermediate through holes 14a-1, 14a-2 are shown as D3 and the diameter of the lower through hole 15a is shown as D4.

Figure 4A:
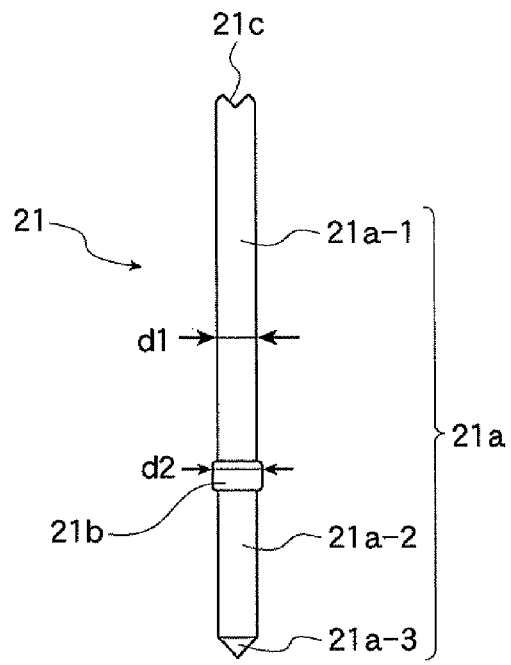
FIGS. 4A, 4B, 4C are side views showing parts of the contact of the same embodiment.
Figure 4B:
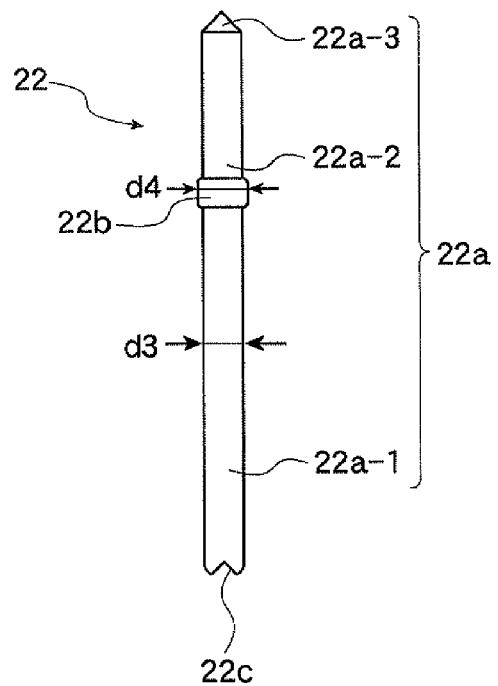

As shown in FIGS. 3, 6A, 6B, the contact 20 which is a part of the contact unit 9 to be disposed in the socket body 10a comprises a terminal side contact member 21 as "contact side member" and as "first electrical part side contact member" which makes contact with the solder ball 1a of the IC package 1 and a base plate side contact member 22 as "contact side member" and as "second electrical part side contact member" which makes contact with the wiring board, and a spring member 23 provided between the terminal side contact member 21 and the base plate side contact member 22 so as to urge the terminal side contact member 21 to the IC package 1 and urge the base plate side contact member 22 to the wiring board 12. As shown in FIGS. 4A, 3, the terminal side contact member 21 comprises a first rod-like portion 21a disposed extending from the upper through hole 13a of the upper plate 13 to the intermediate through hole 14a-1 of the intermediate plate 14x and a first flange portion 21b which is a "flange portion" provided halfway of the first rod-like portion 21a. As shown in FIGS. 4B, 3, the base plate side contact member 22 comprises a second rod-like portion 22a disposed extending from the lower through hole 15a of the lower plate 15 to the intermediate through hole 14a-2 of the intermediate plate 14y and a second flange portion 22b which is a "flange portion" provided halfway of the second rod-like portion 22a.

As shown in FIG. 4A, the first rod-like portion 21a comprises a first upper rod-like portion 21a-1 which is a "contacting side rod-like portion" formed above the first flange portion 21b, a first lower rod-like portion 21a-2 which is a "spring side rod-like portion" formed below the first flange portion 21b, and a first convergent portion 21a-3 formed such that a side making contact with the spring member 23 of the first lower rod-like portion 21a-2 is converged. As shown in FIGS. 3, 4A, the diameter of the first upper rod-like portion 21a-1 and the first lower rod-like portion 21a-2 is d1, which is formed larger than the inside diameter X1 of the spring member 23 and smaller than the outside diameter X2 of the spring member 23. Then, as shown in FIG. 3, the lower side of the first lower rod-like portion 21a-2 makes contact with the upper potion of the spring member 23 and only the first convergent portion 21a-3 of the first rod-like portion 21a is inserted into the spring member 23 from the upper side. Because this structure does not allow the entire first lower rod-like portion 21a-2 to be inserted into the spring member 23 from its upper side, the diameter of the spring member 23 can be made smaller and the entire diameter of the contact 20 can also be made smaller. As shown in FIG. 4A, the upper portion of the first upper rod-like portion 21a-1 which makes contact with the solder ball 1a of the IC package 1 has a concave contact portion 21c which is dented conically as shown in FIG. 4A so that the solder ball 1a can be accommodated therein. Further, the diameter d1 of the first upper rod-like portion 21a-1 and the first lower rod-like portion 21a-2 of the first rod-like portion 21a is set substantially equal to the diameter D1 of the accommodation through hole 11a and the diameter D2 of the upper through hole 13a.

As shown in FIG. 3, the first rod-like portion 21a-1 of the terminal side contact member 21, which is located above the first flange portion 21b, is inserted into the accommodation through hole 11a of the floating plate 11 and at the same time, is inserted into the upper through hole 13a of the upper plate 13. The first lower rod-like portion 21a-2 located lower than the first flange portion 21b is inserted into the intermediate through hole 14a-1 of the intermediate plate 14x.

As shown in FIG. 4B, the second rod-like portion 22a comprises a second lower rod-like portion 22a-1 which is a "contacting side rod-like portion" formed below the second flange portion 22b, a second upper rod-like portion 22a-2 which is a "spring side rod-like portion" formed above the second flange portion 22b and a second convergent portion 22a-3 formed such that a side making contact with the spring member 23 of the second upper rod-like portion 22a-2 is converged. As shown in FIGS. 3, 4B, the diameter of the second lower rod-like portion 22a-1 and the second upper rod-like portion 22a-2 is d3, which is larger than the inside diameter X1 of the spring member 23 and smaller than the outside diameter X2 of the spring member 23. Then, as shown in FIG. 3, the upper side of the second upper rod-like portion 22a-2 makes contact with the lower portion of the spring member 23 and only the second convergent portion 22a-3 of the second rod-like portion 22a is inserted into the spring member 23 from its bottom side. Because such a structure does not allow the entire second upper rod-like portion 22a-2 to be inserted into the spring member 23 from the bottom side, the diameter of the spring member 23 can be reduced and the diameter of the entire contact 20 can also be reduced. The lower portion of the second lower rod-like portion 22a-1 which makes contact with an electrode 12a of the wiring board 12 has a concave contacting portion 22c which is dented conically as shown in FIG. 4B. Further, the diameter d3 of the second lower rod-like portion 22a-1 and the second upper rod-like portion 22a-2 of the second rod-like portion 22a is set substantially equal to a diameter D4 of the lower side through hole 15a.

In the second rod-like portion 22a of the base plate side contact member 22, as shown in FIG. 3, the second lower rod-like portion 22a-1 below the second flange portion 22b is inserted into the lower side through hole 15a of the lower plate 15 and the second upper rod-like portion 22a-2 above the second flange portion 22b is inserted into the intermediate through hole 14a-2 of the intermediate plate 14y.

As shown in FIG. 3, the first flange portion 21b is disposed in a gap S1 between the upper plate 13 and the intermediate plate 14x and has a diameter d2. Further, because the diameter d2 of the first flange portion 21b is formed to be larger than the diameter D2 of the upper through hole 13a of the upper plate 13, the first flange portion 21b never invades into the upper through hole 13a. Therefore, the first flange portion 21b has a function of restricting the terminal side contact member 21 from moving upward by an elastic force of the spring member 23.

As shown in FIG. 3, the second flange portion 22b is disposed in a gap S2 between the intermediate plate 14y and the lower plate 15 and the diameter thereof is d4. Because the diameter d4 of the second flange portion 22b is set larger than a diameter D4 of the lower through hole 15a of the lower plate 15, the second flange portion 22b never invades into the lower through hole 15a. Therefore, the second flange portion 22b has a function of restricting the base plate side contact member 22 from moving downward by an elastic force of the spring member 23.

Consequently, the terminal side contact member 21 is capable of moving upward by an elastic force of the spring member 23 and restricted from moving upward by the first flange portion 21b. The base plate side contact member 22 is capable of moving downward by an elastic force of the spring member 23 and restricted from moving downward by the second flange portion 22b.

As shown in FIG. 3, a positioning insertion rod 31 which is a "positioning member" to be inserted into the accommodation through holes 11a formed in the floating plate 11 is provided detachably on the floating plate 11 of the socket body 10a.

Figure 5A:
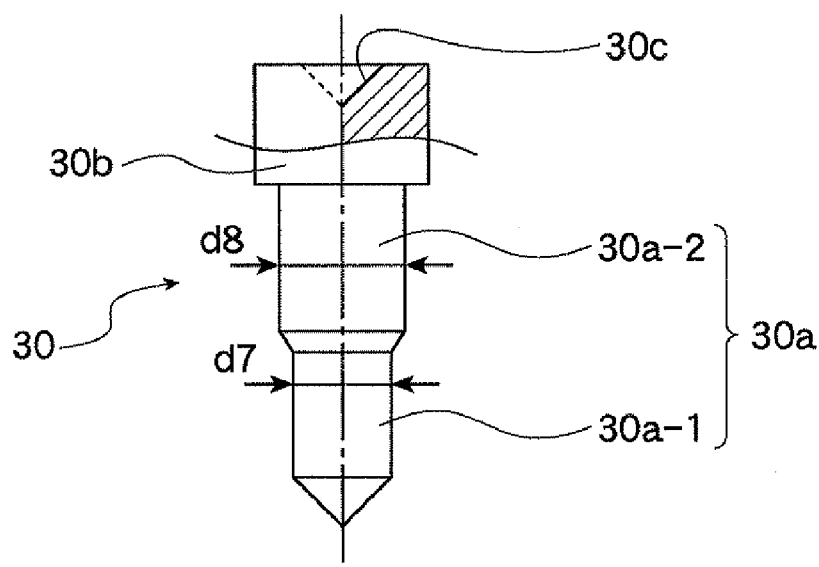
FIGS. 5A, 5B show the structure of a positioning insertion rod of the same embodiment
Figure 5B:
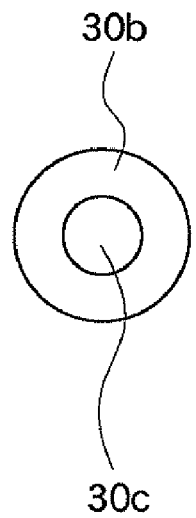

As shown in FIGS. 5A, 5B, this positioning insertion rod 30 includes an insertion portion 30a to be inserted into the accommodation through holes 11a in which no contact 20 is inserted and a head portion 30b which is provided on the top surface of the insertion portion 30a and in which a positioning concave portion 30c is formed. As shown in FIGS. 5A, 5B, the insertion portion 30a includes a front end side portion 30a-1 and a base end side portion 30a-2 provided on the base end side of the front end side portion 30a-1. The diameter of the front end side portion 30a-1 is d7 and the diameter of the base end side portion 30a-2 is d8. The diameter d8 of the base end side portion 30a-2 is set substantially equal to the diameter D1 of the through hole 11a of the floating plate 11 and the diameter d7 of the front end side portion 30a-1 is set smaller than the diameter d8 of the base end side portion 30a-2 (see FIG. 3). The positioning concave portion 31c for positioning when the solder ball 1a of the IC package 1 is inserted therein is formed in the head portion 30b. The positioning concave portion 31c is formed in a conical shape to facilitate the positioning when the solder ball 1a of the IC package 1 is accommodated therein.

Therefore, when the floating plate 11 is located at its uppermost position as shown in FIG. 6A, the solder ball 1a of the IC package 1 is accommodated in the positioning concave portion 30c and when the floating plate 11 is located at the lowermost position as shown in FIG. 6B, the solder ball 1a of the IC package 1 is accommodated in the positioning concave portion 30c formed on the upper portion of the contact 20.

The floating plate 11, the upper plate 13, the intermediate plate 14x, the intermediate plate 14y, and the lower plate 15 are fixed to the socket body 10a by fitting members 31-36 as shown in FIGS. 8A-8F.

Figure 9:
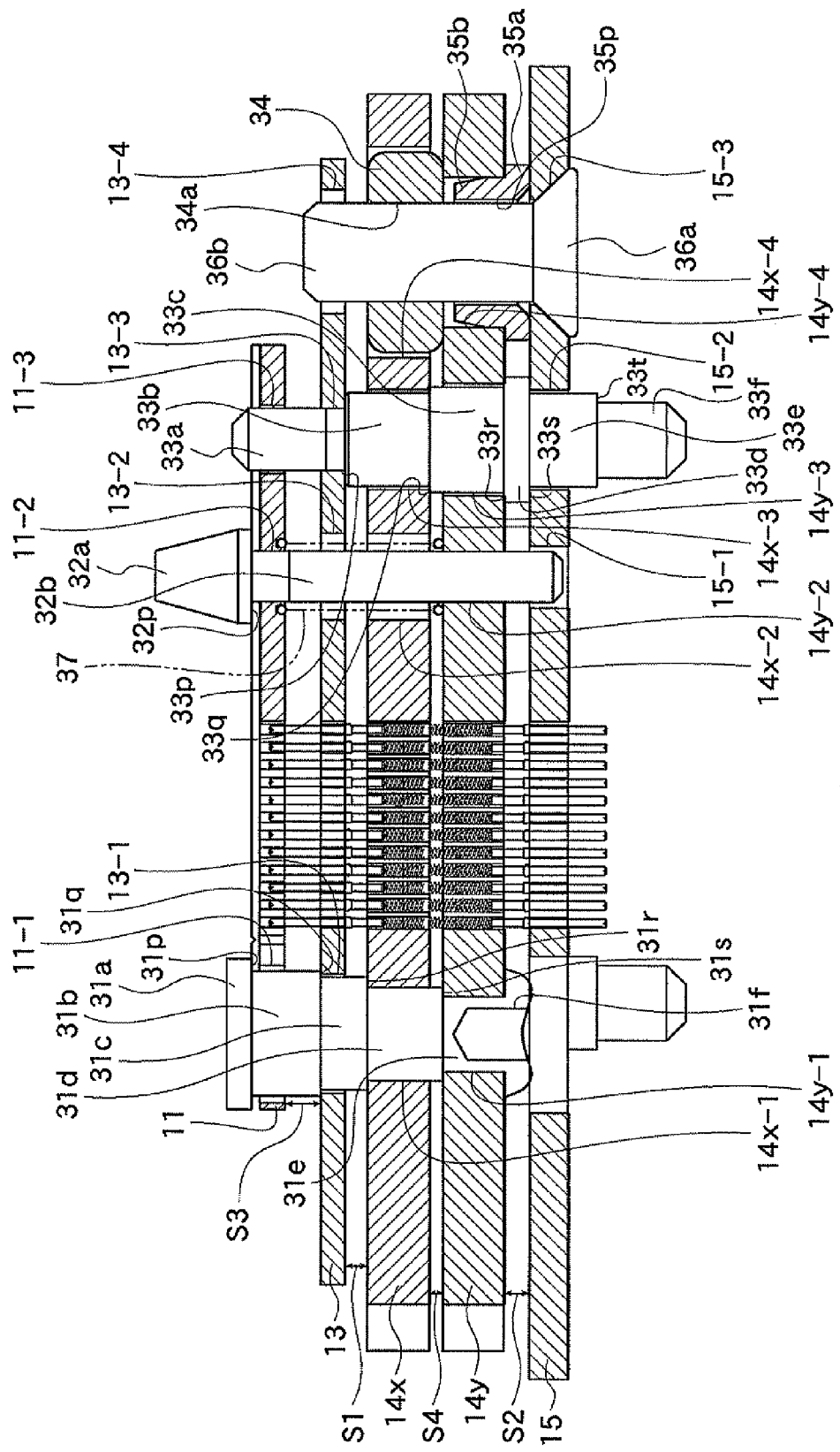
FIG. 9 is a sectional view showing plates and a gap between the plate and a fitting member of a socket for an electrical part of a first embodiment.

As shown in FIG. 9, through holes 11-1, 11-2, 11-3 are formed in the floating plate 11 and through holes 13-1, 13-2, 13-3, 13-4 are formed in the upper plate 13, through holes 14x-1, 14x-2, 14x-3, 14x-4 are formed in the intermediate plate 14x, through holes 14y-1, 14y-2, 14y-3, 14y-4 are formed in the intermediate plate 14y and through holes 15-1, 15-2, 15-3 are formed in the lower plate 15.

As shown in FIGS. 8A, 9, the fitting member 31 includes an upper portion 31a having an outside diameter larger than the diameter of the through hole 11-1 formed in the floating plate 11, a first intermediate portion 31b provided on the lower end of the upper portion 31a, a second intermediate portion 31c provided on the bottom end of the first intermediate portion 31b, a third intermediate portion 31d provided on the bottom end of the second intermediate portion 31c and a bottom portion 31e provided on the bottom end of the third intermediate portion 31d. A concave portion 31f is formed in the bottom portion 31e. In the fitting member 31, as shown in FIG. 9, the bottom portion 31e is fitted to the through hole 14y-1 of the intermediate plate 14y, the third intermediate portion 31d is fitted to the through hole 14x-1 of the intermediate plate 14x, the second intermediate portion 31c is inserted into the through hole 13-1 of the upper plate 13 and the first intermediate portion 31b is inserted into the through hole 11-1 of the floating plate 11. Then, the fitting member 31 is fixed to the intermediate plate 14y by rivet caulking the concave portion 31f.

As shown in FIGS. 8B, 9, the fitting member 32 includes an upper portion 32a having an outside diameter larger than the diameter of the through hole 11-2 formed in the floating plate 11 and an insertion rod portion 32b provided on the lower end of the upper portion 32a. Then, in the fitting member 32, the insertion rod portion 32b is fitted to the through hole 11-2 of the floating plate 11, inserted into the through hole 13-2 of the upper plate 13, inserted into the through hole 14x-2 of the intermediate plate 14x, fitted to the through hole 14y-2 of the intermediate plate 14y and then inserted into the through hole 15-1 of the lower plate 15.

As shown in FIGS. 8C, 9, the fitting member 33 includes an upper portion 33a, a first intermediate portion 33b, a second intermediate portion 33c, a third intermediate portion 33d, a fourth intermediate portion 33e and a bottom portion 33f. Of these, the diameter of the third intermediate portion 33d is set largest. The diameters of the second intermediate portion 33c, the first intermediate portion 33b and the upper portion 33a above the third intermediate portion 33d decrease in this order. The diameters of the fourth intermediate portion 33e and the bottom portion 33f below the third intermediate portion 33d decrease in this order. In the fitting member 33, the front end portion of the upper portion 33a is inserted into the through hole 11-3 of the floating plate 11 and the proximal end side of the upper portion 33a is inserted into the through hole 13-3 of the upper plate 13. The first intermediate portion 33b is inserted into the through hole 14x-3 of the intermediate plate 14x, and the second intermediate portion 33c is inserted into the through hole 14y-3 of the intermediate plate 14y. The third intermediate portion 33d is disposed in a gap between the intermediate plate 14y and the lower plate 15 and the fourth intermediate portion 33e is inserted into the through hole 15-2 of the lower plate 15.

As shown in FIG. 8D, the fitting member 34 is formed in the shape of a nut and a female thread portion 34a is formed therein. The fitting member 35 is a spacer, which is cylindrical as shown in FIG. 8E and comprised of a large diameter portion 35a and a small diameter portion 35b provided on the upper end of the large diameter portion 35a. Further, a hole 35c is formed through the large diameter portion 35a and the small diameter portion 35b. The flat head screw 36 includes a head portion 36a which is formed in a conical shape and a male thread portion 36b provided on the upper end of the head portion 36a. As shown in FIG. 9, the fitting member 34 is inserted into the through hole 14x-4 and the fitting member 35 is inserted into the through hole 14y-4. At this time, the large diameter portion 35a is disposed in the gap between the intermediate plate 14y and the lower plate 15. With this condition, the head portion 36a of the flat head screw 36 is inserted into the lower plate 15-3 and the male thread portion 36b is fitted threadably to the female thread portion 34a of the fitting member 34 through a hole 35c of the fitting member 35 and inserted into the through hole 13-4 of the upper plate 13.

The respective plates 11, 13, 14x, 14y and 15 can be maintained with respective gaps by the fitting members 31-35 and the flat head screw 36.

The gap S1 between the upper plate 13 and the intermediate plate 14 is maintained when the intermediate plate 14x is pressed downward by a step portion 31r between the second intermediate portion 31c and the third intermediate portion 31d of the first fitting member 31 and the upper plate 13 is pressed upward by a step portion 33p between the first intermediate portion 33b of the third fitting member 33 and the upper portion 33a.

A gap 32 between the intermediate plate 14y and the lower plate 15 is maintained when the third intermediate portion 33c of the third fitting member 33 is sandwiched between the intermediate plate 14y and the lower plate 15. Further, even if the fitting members, 34, 35 are tightened with the flat head screw 36, reduction of the gap S2 due to warp of the lower plate 15 never occurs.

Further, a gap S3 between the floating plate 11 and the upper plate 13 is maintained when the upper plate 13 is pressed downward by a step portion 31q between the first intermediate portion 31b and the second intermediate portion 31c of the first fitting member 31 and the insertion rod portion 32b of the second fitting member 32 is inserted so that the floating plate 11 is pressed upward by the spring member 37 provided between the top face of the intermediate plate 14y and the bottom face of the floating plate 11.

A gap S4 between the intermediate plate 14x and the intermediate plate 14y is maintained when the intermediate plate 14y is pressed downward by a step portion 31s between the third intermediate portion 31d and the bottom portion 31e of the first fitting member 31 while the intermediate plate 14x is pressed upward by the second intermediate portion 33c of the third fitting member 33.

In the meantime, the floating plate 11 is urged upward by a spring member 37 provided between the bottom end of the floating plate 11 and the upper end of the intermediate plate 14y and constructed to be capable of moving vertically.

Next, an operation of the IC socket 10 according to the first embodiment of the present invention will be described.

First, when the IC socket 10 is disposed on the wiring board 12, the base plate side contact member 22 of the contact 20 is raised from a state in which it is near the lower plate 15 as shown in FIG. 3 to the side of the intermediate plate 14y shown in FIG. 6A and at the same time, the second flange portion 22b leaves the lower plate 15. Then, when the floating plate 11 is located at the uppermost position, the IC package 1 is mounted on the floating plate 11. At this time, the solder ball 1a expected to perform positioning is accommodated in the positioning concave portion 31c formed in the positioning insertion rod 31 inserted into the accommodation through hole 11a. At the same time, the solder ball 1a expected to connect the IC package 1 and the wiring board 12 electrically is floated from the floating plate 11.

Next, as the floating plate 11 descends to the lowermost position, the solder balls 1a on the IC package 1 make contact with the concave contact portion 21c formed on the top of the terminal side contact member 21 of the contact 20 and the terminal side contact member 21 is pressed by the IC package 1 so that it descends from a state in which it is near the upper plate 13 as shown in FIGS. 3, 6A to the side of the intermediate plate 14x shown in FIG. 6B and at the same time, the first flange portion 21b leaves the upper plate 13. At this time, the solder ball 1a leaves the positioning concave portion 30c in the positioning insertion rod 30.

According to such IC socket 10, the socket body 10a is formed by stacking the upper plate 3, the intermediate plates 14x, 14y, and the lower plate 15 in this order from the above with gaps S1, S2. The through holes 13a, 14a-1, 14a-2, 15a into which each contact 20 is inserted are formed in the upper plate 13, the intermediate plates 14x, 14y and the lower plate 15 and the contact 20 includes the terminal side contact member 21 which makes contact with the terminal 1a, the base plate side contact member 22 which makes contact with the wiring board 12 and the spring member 23 provided between the terminal side contact member 21 and the base plate side contact member 22. The terminal side contact member 21 includes the first rod-like portion 21a which is disposed extending from the upper through hole 13a of the upper plate 13 to the intermediate through hole 14a-1 of the intermediate plate 14x and the first flange portion 21b provided halfway of the first rod-like portion 21a. The base plate side contact member 22 includes the second rod-like portion 22a disposed extending from the intermediate through hole 14a-2 of the intermediate plate 14y to the lower through hole 15a of the lower plate 15 and the second flange portion 22b provided halfway of the second rod-like portion 22a. The first flange portion 21b is disposed in the gap S1 between the upper plate 13 and the intermediate plate 14x and the outside diameter d2 of the first flange portion 21b is set larger than the diameter D2 of the upper through hole 11a of the upper plate 13. The second flange portion 22b is disposed in the gap S2 between the intermediate plate 14y and the lower plate 15 and the outside diameter d4 of the second flange portion 22b is set larger than the diameter D4 of the lower through hole 15a of the lower plate.

Therefore, because the first flange portion 21b is disposed in the gap S1 between the upper plate 13 and the intermediate plate 14x and the second flange portion 22b is disposed in the gap S2 between the intermediate plate 14y and the lower plate 15, the diameter D3 of the intermediate through holes 14a-1, 14a-2 formed in the intermediate plates 14x, 14y can be formed small while maintaining the thickness of the partition wall portions 14b-1, 14b-2 which partition the plurality of intermediate through holes 14a-1, 14a-2 formed in the intermediate plates 14x, 14y from each other to the minimum extent and the pitch of the contacts 20 arranged in the contact unit 9 and the socket body 10a can be reduced.

The spring member 23 side end portion of the first rod-like portion 21a and the spring member 23 side end portion of the second rod-like portion 22a of the first rod-like portion 21a are formed to be convergent and the outside diameter d1 of the first rod-like portion 21a and the outside diameter d3 of the second rod-like portion 22a are formed larger than the inside diameter X1 of the spring member 23 and smaller than the outside diameter X2 of the spring member 23.

Thus, the plurality of plates 13, 14x, 14y, 15 are stacked without any gap like conventional art and the first flange portion 21b and the second flange portion 22b are disposed within the intermediate through holes of the intermediate plates 14x, 14y, thereby eliminating a fear that the first flange portion 21b and the second flange portion 22b may be caught by the intermediate through holes 14a-1, 14a-2 of the intermediate plates 14x, 14y. Accordingly, the terminal side contact member 21 and the base plate side contact member 22 can move within the intermediate plates 14x, 14y vertically smoothly, so that the elastic force of the spring member 23 can be used effectively for a contact between the solder ball 1a of the IC package 1 and the contact 20.

Second Embodiment

Hereinafter, a second embodiment of the present invention will be described.

FIGS. 10A, 10B show the second embodiment of the present invention.

The contact unit 91 of the second embodiment is different from the contact unit 9 of the first embodiment in following points.

That is, the terminal side contact member 41 of the contact 40 is different from the terminal side contact member 21 of the contact 20 of the first embodiment in that while as shown in FIGS. 10A, 10B, the diameter of the first upper rod-like portion 21a-1 is d1, the diameter of the first lower rod-like portion 21a-4 is d5 while d5>d1 and the diameter of the first upper rod-like portion 21a-1 is different from that of the first lower rod-like portion 21a-4. Further, because the diameter d5 of the first lower rod-like portion 21a-4 is substantially equal to the outside diameter X2 of the spring member 23 and substantially equal to the diameter D3 of the intermediate through holes 14a-1, 14a-2, the first lower rod-like portion 21a-4 is unlikely to be tilted within the intermediate through hole 14a-1 so that it can move vertically smoothly. Further, the diameter d5 of the first lower rod-like portion 21a-4 is set larger than the inside diameter X1 of the spring member 23, thereby preventing the first lower rod-like portion 21a-4 from invading into the spring member 23.

Additionally, the first rod-like portion 21a-4 of the terminal side contact member 41 is different from the first lower rod-like portion 21a-2 of the first terminal side contact member 21 of the present invention in that no first convergent portion 21a-3 is formed on the bottom of the first lower rod-like portion 21a-4.

On the other hand, the base plate side contact member 42 of the contact portion 40 is different from the contact 20 of the first embodiment of the present invention in that as shown in FIGS. 10A, 10B, the diameter of the second lower rod-like portion 22a-1 is d3, the diameter of the second upper rod-like portion 22a-4 is d6 while d6>d3, and the diameters of the second lower rod-like portion 22a-1 and the second upper rod-like portion 22a-4 are different. Because the diameter d6 of the second upper rod-like portion 22a-4 is substantially equal to the outside diameter X2 of the spring member 23 and substantially equal to the diameter D3 of the intermediate through holes 14a-1, 14a-2, the second upper rod-like portion 22a-4 is unlikely to be tilted within the intermediate through hole 14a-2 so that it can move vertically smoothly. Further, the diameter d6 of the second upper rod-like portion 22a-4 is set larger than the inside diameter X1 of the spring member 23 thereby preventing the second upper rod-like portion 22a-4 from invading into the spring member 23.

Further, the second upper rod-like portion 22a-4 of the base plate side contact member 42 is different from the second upper rod-like portion 22*a*-2 of the base plate side contact member 22 of the first embodiment in that no second convergent portion 22*a*-3 is formed on the top of the second upper rod-like portion 22*a*-4.

The other structure is equal to the first embodiment of the present invention.

Third Embodiment

Hereinafter, a third embodiment of the present invention will be described.

Figure 11A:
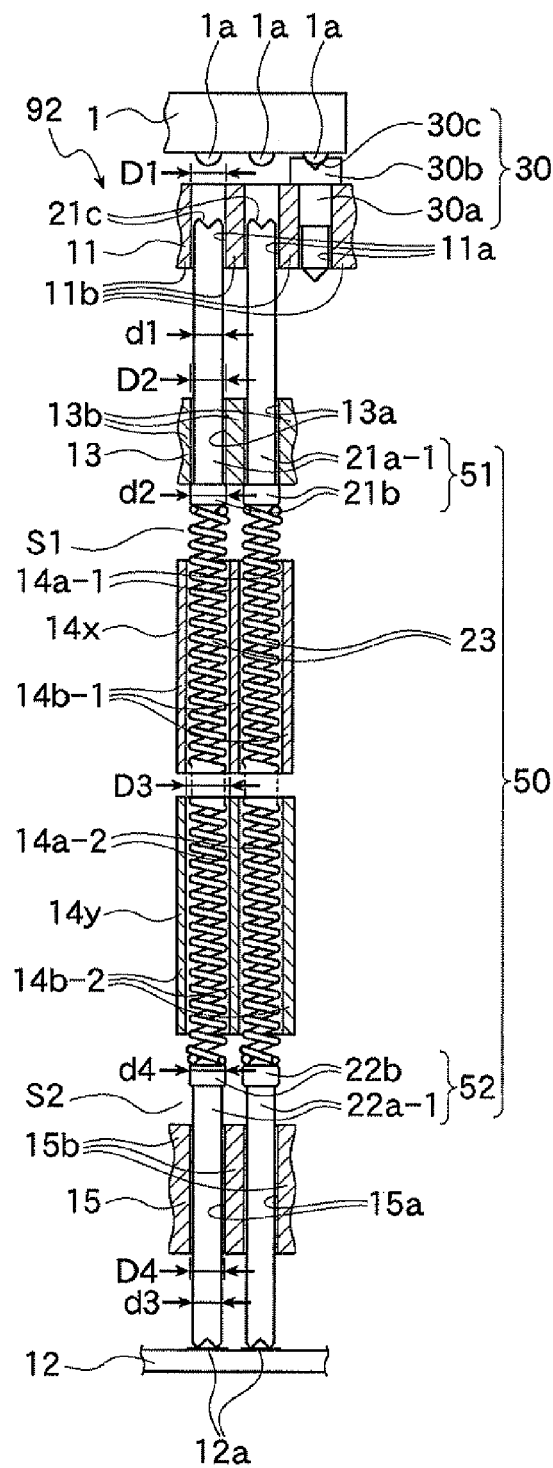
FIGS. 11A, 11B are enlarged sectional views showing the relation among the IC package, a plurality of plates and wiring board according to a third embodiment of the present invention.
Figure 11B:
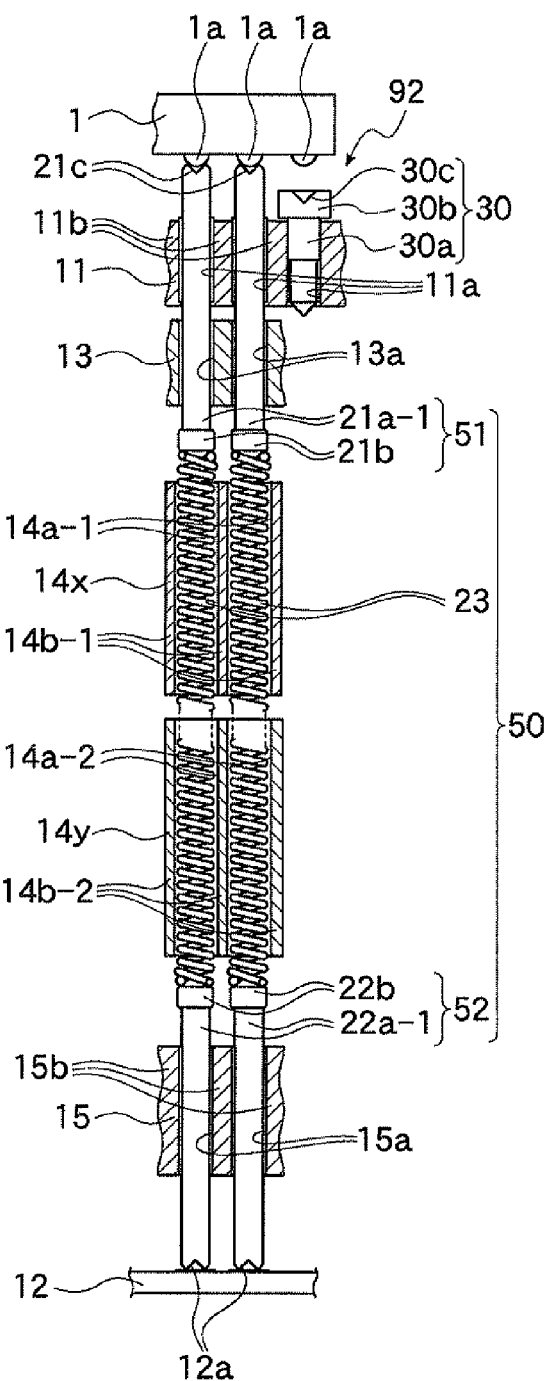

FIGS. 11A, 11B show the third embodiment of the present invention.

The contact unit 92 of the third embodiment is different from the contact unit 9 of the first embodiment in following points.

In the contact 50, as shown in FIGS. 11A, 11B, the terminal side contact member 51 has no first lower rod-like portion 21*a*-2 or first convergent portion 21*a*-3 unlike the contact 20 and the base plate side contact member 52 has no second upper rod-like portion 22*a* or second convergent portion 22*a*-3 unlike the contact portion 20.

Consequently, as shown in FIGS. 11A, 11B, the top of the spring member 23 makes a direct contact with the first flange portion 21*b* and the bottom of the spring member 23 makes a direct contact with the second flange portion 22*b*.

With such a structure, the flange portions 21*b*, 22*b* can not be caught by the intermediate through holes 14*a*-1, 14*a*-2 of the intermediate plates 14*x*, 14*y* as compared with a case where the plurality of plates are stacked without any gap so that the flange portions are disposed within the intermediate plates. Further, such a simple structure in which no other member is provided between the flange portions 21*b*, 22*b* and the spring members 23 can be attained.

Accordingly, the terminal side contact member 21 and the base plate side contact member 22 can move vertically within the through hole 13*a* of the upper plate 13 and the through hole 15*a* of the lower plate 15 smoothly and the elastic force of the spring member 23 can be used effectively for a contact between the terminal la and the electrode 12*a*, thereby cutting cost for the terminal side contact member 51 and the base plate side contact member 52.

The other structure is equal to the first embodiment of the present invention.

In the first-third embodiments of the present invention, the relationship between the diameter d2 of the first flange portion 21*b* of the terminal side contact member 21 and the diameter D of the intermediate through hole 14*a*-1 in the intermediate plate 14*x* has not been explained clearly. Additionally, the relationship between the diameter d4 of the second flange portion 22*b* of the base plate side contact member 22 and the diameter D3 of the intermediate through hole 14*a*-2 in the intermediate plate 14*y* has been not described clearly.

However, the diameter d2 of the first flange portion 21*b* can be set larger than the diameter D3 of the intermediate through hole 14*a*-1 or the diameter d4 of the second flange portion 22*b* can be set larger than the diameter D3 of the intermediate through hole 14*a*-2. Consequently, the first flange portion 21*b* can move smoothly without invading into the intermediate through hole 14*a*-1 or being caught within the intermediate through hole 14*a*-1 and the second flange portion 22*b* can move smoothly without invading into the intermediate through hole 14*a*-2 or being caught by the intermediate through hole 14*a*-2.

The diameter d2 of the first flange portion 21*b* or the diameter d4 of the second flange portion 22*b* can be set smaller than the diameter D3 of the intermediate through hole 14*a*-1.

According to the first embodiment, both the spring member 23 side end portion of the first rod-like portion 21*a* and the spring member 23 side end portion of the second rod-like portion 22*a* are formed to be convergent, the outside diameter d1 of the first rod-like portion 21*a* and the outside diameter d3 of the second rod-like portion 22*a* are formed larger than the inside diameter X1 of the spring member 23 and smaller than the outside diameter X2 of the spring member 23. However, only any one of the first rod-like portion 21*a* and the second rod-like portion 22*a* may be formed in such a manner.

Figure 4C:
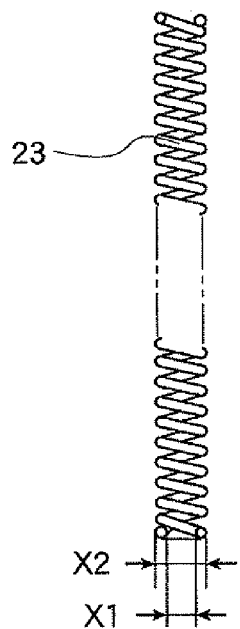

Although according to the first to third embodiments of the present invention, the spring member 23 is formed of a coil spring which is circular as seen in a plan view as shown in FIGS. 4A-4C, the present invention is not restricted to the above-described embodiments. That is, it may be constructed of a leaf spring or the like although not shown.

Although according to the first to third embodiments of the present invention, the terminal side contact member 21, 41, 51 and the base plate side contact member 22, 42, 52 are circular as seen in its plan view or its sectional view, the present invention is not restricted to the above-described embodiments. That is, the terminal side contact member 21, 41, 51 and the base plate side contact member 22, 42, 52 may be constructed of a square rod as seen in its plan view or sectional view.

Further, although according to the first to third embodiments of the present invention, the contact units 9, 91, 92 is constructed to be provided on the wiring board 12, it is not restricted to the above-described embodiments. That is, it may be disposed on other than the wiring board such as flexible print circuit (FPC sheet).

Although according to the first to third embodiments of the present invention, the electrical part socket 10 is provided with the contact unit 9, 91, 92, the present invention is not restricted to the above-described embodiments. That is, it may be constituted of only the contact unit 9, 91, 92 like a probe card.

What is claimed is:

1. A contact unit provided on a socket body, disposed on a second electrical part and accommodating a first electrical part, the contact unit electrically connects the first electrical part and a second electrical part through a plurality of contacts, wherein an upper plate, an intermediate plate, and a lower plate are stacked in this order from the above with a gap formed between each plate and the upper plate, the intermediate plate and the lower plate are provided with through holes into which the contacts are each inserted, the contact comprises a first electrical part side contact member which makes contact with the first electrical part, a second electrical part side contact member which makes contact with the second electrical part, and a spring member which is provided between the first electrical part side contact member and the second electrical part side contact member so as to urge the first electrical part side contact member and the second electrical part side contact member in a direction departing from each other, the first electrical part side contact member comprises a first rod-like portion disposed extending from the through hole of the upper plate to the through hole of the intermediate plate and a first flange portion provided halfway of the first rod-like portion, and the second electrical part side contact member comprises a second rod-like portion disposed extending from the through hole of the lower plate to the through hole of the intermediate plate and a second flange portion provided halfway of the second rod-like portion, the first flange portion is formed larger than the through hole of the upper plate and disposed in the gap between the upper plate and the intermediate plate so that the first electrical part side contact member is urged toward the upper plate by the spring member, the second flange portion is formed larger than the through hole of the lower plate and disposed in the gap between the lower plate and the intermediate plate so that the second electrical part side contact member is urged toward the lower plate by the spring member, and a lower end portion of the first electrical part side contact member contacts directly with an upper end portion of the spring member, and an upper end portion of the second electrical part side contact member contacts directly with a lower end portion of the spring member.

2. The contact unit according to claim 1, wherein the lower end portion of the first electrical part side contact member is larger than an inside diameter of the spring member, and the upper end portion of the second electrical part side contact member is larger than the inside diameter of the spring member.

3. The contact unit according to claim 1, wherein:

the first flange portion is formed at an end portion, nearest to the intermediate plate, of the first rod-like portion, the first flange portion directly contacting with the spring member and being urged toward the first electrical part, and the second flange portion is formed at an end portion, nearest to the intermediate plate, of the second rod-like portion, the second flange portion being urged towards the second electrical part.

* * * * *